United States Patent
Tam (10) Patent No.: US 8,634,267 B2
(45) Date of Patent: Jan. 21, 2014

(54) FLASH MEMORY CHIP POWER MANAGEMENT FOR DATA RELIABILITY AND METHODS THEREOF

(75) Inventor: Eugene Jinglun Tam, Saratoga, CA (US)

(73) Assignee: SanDisk Technologies Inc., Plano, TX (US)

( * ) Notice: Subject to any disclaimer, the term of this patent is extended or adjusted under 35 U.S.C. 154(b) by 58 days.

(21) Appl. No.: 13/471,198

(22) Filed: May 14, 2012

(65) Prior Publication Data

US 2013/0301373 A1 Nov. 14, 2013

(51) Int. Cl.
*G11C 5/14* (2006.01)

(52) U.S. Cl.
USPC ............. 365/228; 365/185.09; 365/226

(58) Field of Classification Search
USPC .............. 365/185.09, 185.18, 229, 228, 226
See application file for complete search history.

(56) References Cited

U.S. PATENT DOCUMENTS

| | | | |
|---|---|---|---|
| 4,001,609 A * | 1/1977 | Sickert | 327/143 |
| 4,692,903 A | 9/1987 | Borg et al. | |
| 5,883,532 A * | 3/1999 | Bowers | 327/143 |
| 6,166,960 A | 12/2000 | Marneweck et al. | |
| 6,512,698 B2 * | 1/2003 | Kamei | 365/185.23 |
| 7,532,027 B2 * | 5/2009 | Lazaravich et al. | 326/8 |
| 7,567,098 B2 | 7/2009 | Frew et al. | |
| 2002/0126561 A1 | 9/2002 | Roohparvar | |
| 2004/0113176 A1 | 6/2004 | Honma et al. | |
| 2006/0062070 A1 | 3/2006 | Sibigtroth et al. | |
| 2010/0241282 A1 | 9/2010 | Culshaw et al. | |
| 2011/0012650 A1 | 1/2011 | Scobie et al. | |

OTHER PUBLICATIONS

Notification of Transmittal of the International Search Report and the Written Opinion of the International Searching Authority, or the Declaration of Int'l Appl. No. PCT/US2013/038367 mailed Nov. 5, 2013, 9 pages.

* cited by examiner

*Primary Examiner* — Andrew Q Tran
(74) *Attorney, Agent, or Firm* — Davis Wright Tremaine LLP (57) ABSTRACT

A power supply voltage for a memory chip is compared with a plurality of threshold voltages that correspond to voltages below which classes of memory operations can no longer be guaranteed. When the power supply voltage drops below a threshold voltage, appropriate action is taken, which may include generating an indicator such as a flag, proceeding with the operations in some modified manner, or disabling operations that are no longer guaranteed, either permanently or until power is restored, or until some other appropriate time.

19 Claims, 4 Drawing Sheets

| VDD | Read | Program | Erase | Others |
|---|---|---|---|---|
| Above 4 | OK | OK | OK | OK |
| Below 4 | OK | OK | Disable/indicator | OK |
| Below 3 | OK | Disable/indicator | Disable/indicator | OK |
| Below 2 | Safe mode | Disable/indicator | Disable/indicator | OK |
| Below 1 | Abort all operations, set status, POR when VDD goes above 1 | | | |
| Below 0 | No action possible | | | |

FLASH MEMORY CHIP POWER MANAGEMENT FOR DATA RELIABILITY AND METHODS THEREOF

BACKGROUND

This application relates to the operation of re-programmable memory systems such as semiconductor flash memory systems, and, more specifically, to systems and methods for managing power in such memory systems when a power supply voltage drops.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card is ideally suited in the mobile and handheld environment because of its small size, low power consumption, high speed and high reliability features.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. In particular, flash memory such as Flash EEPROM allows entire blocks of memory cells to be erased at the same time.

In addition to flash memory, other forms of nonvolatile memory may be used in nonvolatile memory systems. For example Ferroelectric RAM (FeRAM, or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. Various other nonvolatile memories are also in use or proposed for use in nonvolatile memory systems.

A common memory system comprises one or more memory chips that are mounted on a printed circuit board, along with a memory controller chip, and enclosed in a housing to form a memory card, Universal Serial Bus (USB) flash drive, or Solid State Drive (SSD) that has a physical interface that allows it to be connected with a range of host devices. Typically, the memory system receives its power from a host through such an interface so that it is dependent on the host for its power. The voltage at which electrical power is supplied by the host may be set by an interface standard (e.g. USB provides a 5.0 volt power supply). There is generally some range of acceptable supply voltage that the host is expected to provide. If the voltage drops below that range, the memory system may reset causing all ongoing memory operations to stop, potentially causing loss of data that is not yet saved, and requiring time and power to recover if the power supply voltage returns to its specified range.

In mobile devices, power is typically provided by a battery. Current may be drawn from the battery by different components at different times so that the power supply voltage may drop as significant current is drawn. Because battery life is an important feature in mobile devices, manufacturers attempt to extend the battery life by continuing to run the mobile device as the battery nears exhaustion. However, the voltage supplied by the battery may drop from its nominal value in this near-exhaustion condition. Multiple power demands make it difficult for a mobile host to provide a power supply at a consistent voltage to a memory system especially as the battery nears exhaustion. Fluctuations in the power supply voltage may cause problems even before the power supply voltage reaches a point where a reset is triggered. Therefore, there is a need for a power management system for dealing with fluctuations in power supply voltage, particularly in mobile devices.

SUMMARY

According to a general aspect of the invention, a memory chip includes a voltage comparison circuit that compares a power supply voltage with multiple threshold voltages and provides indicators when the power supply voltage drops below a threshold voltage. The memory chip also includes a power management circuit that responds to drops in the power supply voltage as indicated by the voltage comparison circuit. Threshold voltages may be chosen to correspond to voltages below which particular operations, or groups of operations, become unreliable, and can no longer be guaranteed. The power management circuit may respond to a voltage drop below a threshold voltage in several different ways. The operations in the affected class (class of operations that can no longer be guaranteed) may be disabled, either temporarily or indefinitely. In some cases, the operations are allowed to continue, either in a modified form, or with some indicator to the host so that the host is aware that the operations may not be completed satisfactorily.

A method of operating a nonvolatile memory chip according to an example includes: comparing a power supply voltage to a plurality of threshold voltages that includes at least a first threshold voltage and a second threshold voltage that is lower than the first threshold voltage; when the power supply voltage drops below the first threshold voltage, disabling a first class of memory operations; and when the power supply voltage drops below the second threshold voltage, disabling the first class of memory operations and additionally disabling a second class of memory operations that is not disabled when the power supply voltage drops below the first threshold voltage.

When the power supply voltage drops below the first threshold voltage, the first class of memory operations may be temporarily disabled and memory operations from the first class of memory operations may be queued for later execution. Queued memory operations may subsequently be executed when the power supply voltage rises above the first threshold voltage. When the power supply voltage drops below the first threshold voltage a first status indicator may be generated and the memory system may wait for a command to enable the first class of memory operations; and when the power supply voltage drops below the second threshold voltage, a second status indicator may be generated and the memory system may wait for a command to enable the second class of memory operations. The first class of memory operations may include a memory cell erasing operation and the second class of memory operations may include a memory programming operation.

The plurality of threshold voltages may include at least a third threshold voltage that is lower than the second threshold voltage, and a fourth threshold voltage that is lower than the third threshold voltage; when the power supply voltage drops below the third threshold voltage, the first and second classes of memory operations may be disabled and additionally a third class of memory operations that is not disabled when the power supply voltage drops below the second threshold voltage may be disabled; and when the power supply voltage drops below the fourth threshold voltage, the first, second, and third classes of memory operations may be disabled and additionally a fourth class of memory operations that is not disabled when the power supply voltage drops below the third threshold voltage may be disabled. The third class of memory operations may include a memory read operation and the fourth class of operations may include a register setting operation.

A nonvolatile memory chip according to an example includes: an array of nonvolatile memory cells; a power input that receives an electrical supply at a supply voltage; a voltage comparison circuit connected to the power input, the voltage comparison circuit comparing the supply voltage to a first threshold voltage and a second threshold voltage, the voltage comparison circuit providing a first signal when the supply voltage is below the first threshold voltage and providing a second signal when the supply voltage is below the second threshold voltage; and a power management circuit that is configured to disable only a first class of memory operations in response to the first signal, the power management circuit configured to disable the first class of memory operations and additionally disable a second class of memory operations that is not disabled in response to the first signal, in response to the second signal.

The nonvolatile memory chip may include a command buffer that holds commands that correspond to disabled memory operations for later execution. The voltage comparison circuit may further compare the supply voltage to a third threshold voltage and a fourth threshold voltage, the voltage comparison circuit providing a third signal when the supply voltage is below the third threshold voltage and providing a fourth signal when the supply voltage is below the fourth threshold voltage; and the power management circuit may be configured to disable the first class, second class, and a third class of memory operations in response to the third signal, and to disable the first class, second class, third class, and a fourth class of memory operations in response to the fourth, signal.

The first class of memory operations may include an erase operation, the second class of memory operations may include a program operation, the third class of memory operations may include a read operation, and the fourth class of operations may include a register setting operation.

A method of operating a nonvolatile memory chip according to an example includes: comparing a power supply voltage to a plurality of threshold voltages that includes at least a first threshold voltage, a second threshold voltage, a third threshold voltage, and a fourth threshold voltage; when the power supply voltage drops below the first threshold voltage, disabling only a first class of memory operations that includes a memory erase operation; when the power supply voltage drops below the second threshold voltage, disabling the first class of memory operations, and additionally disabling a second class of memory operations that includes a memory programming operation; when the power supply voltage drops below the third threshold voltage, disabling the first class of memory operations, the second class of memory operations, and additionally disabling a third class of memory operations, and providing a signal that indicates to a host that a low-power condition exists; and when the power supply voltage drops below the fourth threshold voltage, initiating a full chip reset and setting a chip error flag.

A first indicator may be generated when the power supply voltage drops below the first threshold voltage, a second indicator may be generated when the power supply voltage drops below the second threshold voltage.

A method of operating a nonvolatile memory chip according to an example includes: comparing a power supply voltage to a plurality of threshold voltages that includes at least a first threshold voltage and a second threshold voltage that is lower than the first threshold voltage; when the power supply voltage drops below the first threshold voltage, generating a first status indicator; and when the power supply voltage drops below the second threshold voltage, generating a second status indicator.

When the power supply voltage drops below the first threshold voltage, a first class of memory operations may be disabled; and when the power supply voltage drops below the second threshold voltage, a second class of memory operations may be disabled. When the power supply voltage drops below the first threshold voltage, a first class of memory operations that is no longer guaranteed to be successfully completed may continue to be performed; and when the power supply voltage drops below the second threshold voltage, a second class of memory operations that is no longer guaranteed to be successfully completed may continue to be performed. The second class of memory operations may include a memory program operation, and when the power supply voltage drops below the second threshold voltage, programing may continue in a modified manner. The plurality of threshold voltages may further include a third threshold voltage that is lower than the second threshold voltage, and when the power supply voltage drops below the third threshold voltage, a third status indicator may be generated and a third class of memory operations that is no longer guaranteed to be successfully completed may continue to be performed. The third class of memory operations may include a memory read operation, and a memory read operation may be continued in a safe manner that uses error correction coding.

Various aspects, advantages, features and embodiments of the present invention are included in the following description of examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
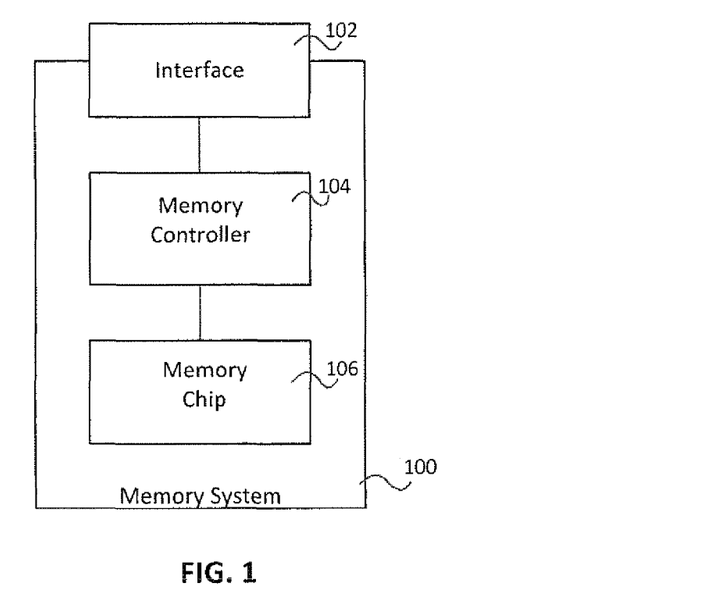
FIG. 1 illustrates schematically the main hardware components of a memory system suitable for implementing the present invention.

FIG. 1 illustrates schematically the main hardware components of a memory system 100 suitable for implementing the present invention. The memory system 100 includes an interface 102 which allows the memory system 100 to connect to, and communicate with, a host system (not shown). For example, the memory system may be a memory card, Solid State Drive (SSD) or embedded memory system in a mobile device such as a smart phone, tablet PC, laptop, or digital camera. Some interfaces allow the memory system to be removably connected to a variety of hosts by using a standard physical interface that couples with a corresponding interface on a host. Other interfaces may be suitable for more permanent attachment to a host. Typically, an interface standard specifies various physical and electrical parameters. For example, the number of Input/Outputs (I/Os) and the assignment of such I/Os may be specified. Typically, an interface includes multiple data and address I/Os in a parallel arrangement, and some additional I/Os such as ground, clock, and a power supply.

A memory controller 104 manages data in the memory system and may provide translation between the host and the memory chip 106. A memory controller may serve a variety of functions including assigning physical addresses to host data and recording the correspondence between physical addresses and host addresses (logical-to-physical mapping), performing Error Correction Coding (ECC), detecting and recording the locations of bad blocks in the memory chip, and performing background operations such as garbage collection. A memory controller is typically formed as an Application Specific Integrated Circuit (ASIC) and the specific functions performed by a given memory controller depend on the memory system in which it is to be used.

The memory system 100 includes just one memory chip 106 for simplicity. Other memory systems may include multiple memory chips. For example, two, four, eight or more memory chips may be connected to a memory controller (either using a single bus, or multiple busses). In particular, SSDs may use large numbers of memory chips to form a large memory that is capable of acting as the primary mass data storage in a mobile device.

Figure 2:
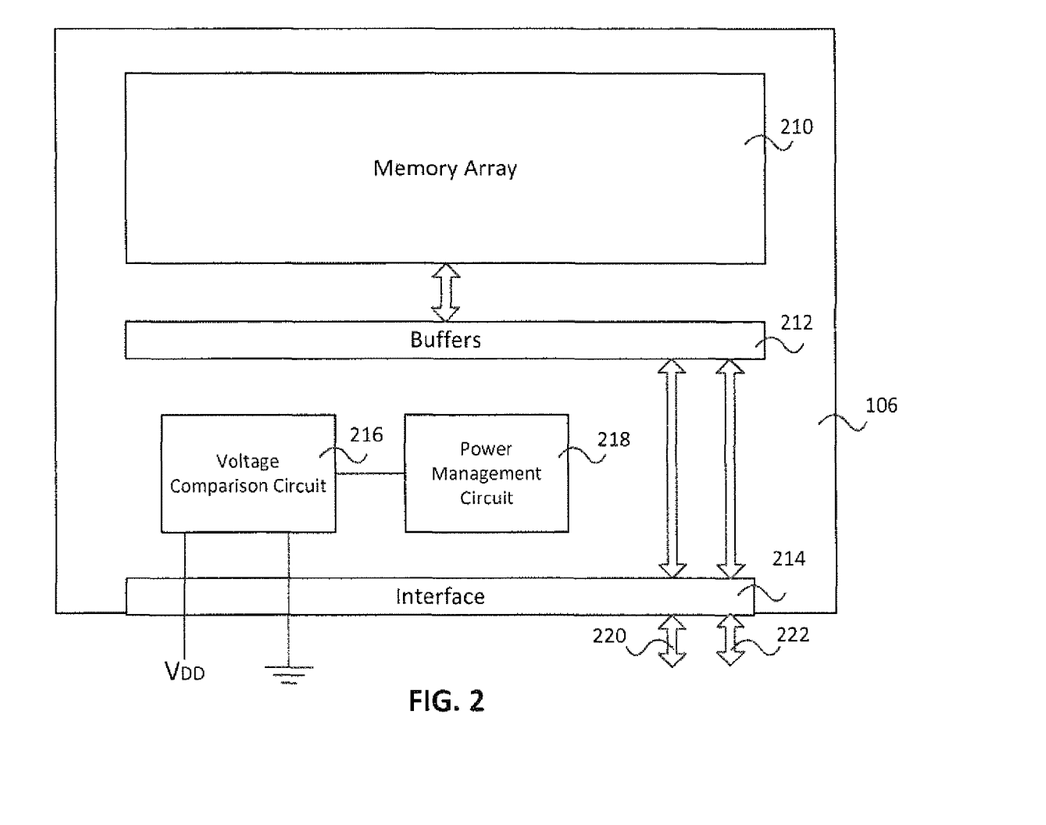
FIG. 2 illustrates certain components of a memory chip including power circuits.

FIG. 2 shows a more detailed view of certain components of the memory chip 106. In particular, FIG. 2 shows that the memory chip 106 includes a memory array 210 (an array of memory cells with word lines and bit lines to access memory cells). The memory chip also includes buffers 212 that are connected to the memory array 210 so that data can be stored before being written to the memory array, or after it is read from the memory array. Other information, such as address information, may also be buffered. An interface 214 in the memory chip connects the memory chip to the memory controller. The interface 214 communicates with the memory controller 104, receiving host data and address information from the memory controller over data Input/Output (I/O) 220 and address I/O 222 respectively, and returning stored data to the memory controller. The interface 214 also communicates with the buffers 212 and the memory array 210. Host data that is to be stored in the memory array 210 is received by the interface 214 and sent to the memory array 210 (and may be buffered between the interface and the memory array). Host data that is read from the memory array 210 is sent to the memory controller by the interface 214. Read data may also be buffered before being sent. In addition to storing host data, the buffers 212 may store address and command information. For example, buffers may store a queue of operations that are to be executed. Such operations may correspond to host commands, or may be related to internal memory system functions. The interface also has other I/Os including a power supply ($V_{DD}$) and ground.

The memory chip 106 may include various circuits related to supplying power to the components of the memory chip. For example, charge pumps (not shown) may be used to generate a high voltage, such as the high voltage needed to erase flash memory cells. Voltage regulators (not shown) may be used to provide specific voltages that are needed for various operations (e.g. voltage may be stepped down from $V_{DD}$). Typically, all voltages needed in a memory chip are derived from a single electrical power supply such as $V_{DD}$, with higher and lower voltages being produced by on-chip power circuits such as charge pumps and voltage regulators. In such an arrangement, all operations may be affected by any drop in $V_{DD}$. In other memory chips, multiple power supply voltages may be provided and may be separately monitored. FIG. 2 omits components that are well known and it will be understood that the present embodiments are not limited to the components illustrated.

The memory chip 106 includes a voltage comparison circuit 216 that is connected to the power input ($V_{DD}$), and a power management circuit 218 that is connected to the voltage comparison circuit 216. According to certain embodiments of the present invention, a voltage comparison circuit and a power management circuit may implement power management schemes that provide significant advantages over a scheme that uses a single low-voltage to trigger a reset.

The voltage comparison circuit 216 compares the power supply voltage, $V_{DD}$, with multiple threshold voltages and provides information to the power management circuit 218 to indicate if $V_{DD}$ is above or below any of the threshold voltages. This provides information regarding $V_{DD}$ that can be used by the power management circuit 218 to proactively manage operations in the memory chip according to the level of $V_{DD}$. The voltage comparison circuit 218 is shown as connected only to $V_{DD}$ and ground. However, other power supply voltages (if provided) may also be monitored in this way, and where $V_{DD}$ is supplied on multiple inputs, each input may be subject to comparison.

The power management circuit 218 receives information from the voltage comparison circuit regarding the power supply voltage and modifies the operation of the memory chip in response. In contrast to prior memory chips, which had a single threshold voltage below which a reset occurred, embodiments of the present invention include monitoring $V_{DD}$ over a range of voltage above the voltage at which a reset is triggered. This range of voltage; from the nominal value of $V_{DD}$ to the voltage at which a reset is triggered, may be considered a gray zone in which there may be sufficient power supply voltage for some, but not all, memory operations to be guaranteed. According to an embodiment, a power management circuit disables any operations for which there is insufficient power supply voltage. These disabled operations may be stopped permanently (i.e. the operation is not stored and a new command would be needed to reinitiate the operation), or may be queued for later execution whenever $V_{DD}$ returns to an adequate level. According to another embodiment, the power management circuit does not disable operations even when $V_{DD}$ drops to a level that means they may not execute successfully. Instead, the power management circuit generates an indicator that the power supply voltage has dropped but allows the operation, or operations, to continue. The memory controller, or host, may then return a command indicating how to deal with the low-voltage condition, and may separately take action to avoid problems relating to low-power operation (e.g. if program operation is potentially affected, the host may store a redundant copy elsewhere).

Different memory operations have different power supply voltage requirements. Thus, different memory operations become unreliable at different levels of $V_{DD}$. By identifying the power supply voltage required for a particular operation, or class of operations, a power management circuit may disable memory operations selectively as $V_{DD}$ drops.

Figure 3:
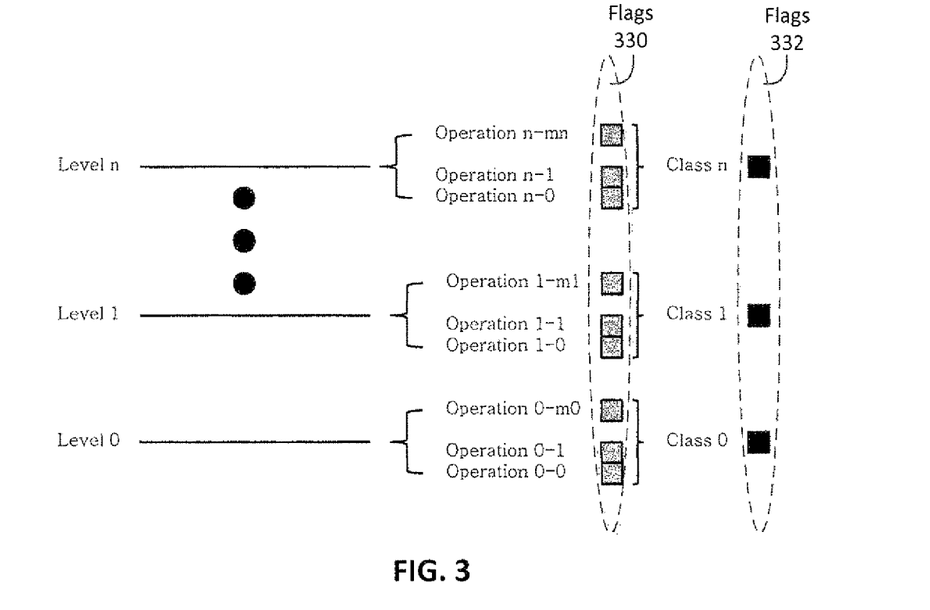
FIG. 3 illustrates certain classes of memory operations and associated flags.

FIG. 3 shows an example of different classes of memory operations in a flash memory, with the classes arranged in order of the power supply voltage required (i.e. class n requires highest voltage, class 0 requires lowest voltage). Each class of memory operations requires a particular voltage level in order to guarantee that the operations of that class can be successfully completed. For example, the operations of class n (operations n-0 to n-mn) require a voltage of at least level n to guarantee successful execution (a lower voltage may still work but there is a risk of failure). The lowest voltage level shown, level 0, corresponds to a level below which no memory operation can be guaranteed. This voltage may correspond to a voltage used to trigger a reset. It will be understood that there is no particular limit on the number n, and that the number of classes used depends on the memory chip and the voltage levels needed for the various memory operations of the particular memory chip. While it may be easier to group memory operations into classes as shown, a class may consist of a single memory operation in some cases. Each of the voltage levels shown, level 0-level n, may be used as a threshold voltage in a voltage comparison circuit so that an indicator is generated by the voltage comparison circuit when the power supply voltage drops below any of the voltage levels. This provides an indication that the corresponding class of memory operations is not guaranteed and appropriate action may be taken in response.

Monitoring a power supply voltage may be achieved in several different ways. Continuous comparison with all threshold voltages is one option. However, this may be more burdensome than necessary. Comparison may be done on an intermittent basis at some given frequency. Comparison may be performed for only those voltage levels for which corresponding memory operations are about to be performed (e.g. if the only operation to be performed is in class n, there may be little or no value in checking if the voltage is above level 0 or level 1, it is sufficient to know if it is above or below level n). Where operations are to be performed from multiple classes, only the highest voltage level corresponding to one of the classes of operations to be performed may be monitored (e.g. if operations are to be performed from class 1 and class 0, only voltage level 1 may be monitored—if the voltage exceeds level 1 then it necessarily exceeds level 0 and this does no need to be separately checked). If the power supply voltage drops below the highest voltage level, then the next highest voltage level may be monitored (e.g. if the power supply voltage drops below level 1, then class 0 operations may still be possible as long as the power supply voltage stays above level 0, and so level 0 is monitored).

An example of how operations may be classified in different classes with corresponding threshold voltage levels is the following example, which relates to NAND flash memory:

Level 0 operations:
 Command interpreter
 Status polling
 Power supply detection
 Power supply error flag set/reset
Level 1 operations:
 Data latch operation
 Register operation
 On-Chip logic controller operation
 Power up sequence (including ROMFUSE read)
Level 2 operations:
 Read & verify from memory
Level 3 operations
 Program into memory cell
Level 4 operations:
 Erase memory cells.

FIG. 3 shows flags 330 associated with each operation and flags 332 associated with each class of operations. When a particular operation is to be performed, the flag associated with the particular operation is set, and the flag associated with the class of operations that includes the particular operation is also set (the flag for a class of operations is automatically set whenever the flag for any individual operation in that class is set). Then the level associated with the highest class flag that is set is the level that needs to be monitored by the voltage comparison circuit. Thus, the voltage comparison circuit may only have to perform comparison with a single threshold voltage at any given time.

Figure 4:
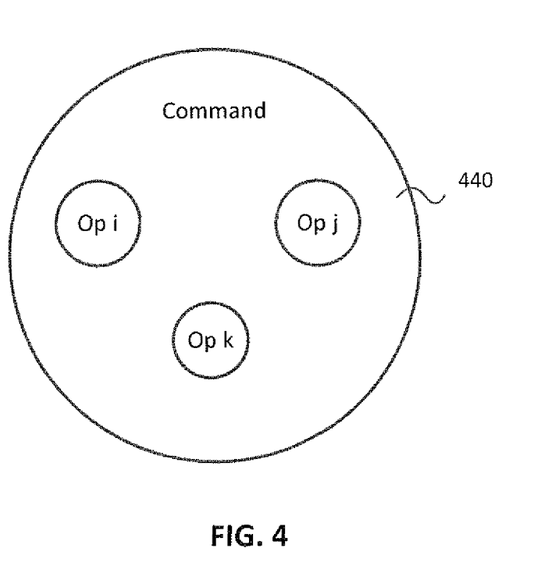
FIG. 4 illustrates a host command and corresponding memory operations.

A host command or a command from the memory controller may correspond to multiple memory operations. A single host command may be translated by the memory controller into multiple controller commands to a memory chip. These controller commands may in turn require multiple memory operations. FIG. 4 illustrates how a single such command, Command 440, may include multiple memory operations, Op i, Op j, and Op k. For example, where a host sends a single command to write certain host data, the memory controller may then break down the host data and assign it to different physical locations (pages) in the memory array. The memory controller may then send multiple write commands corresponding to these pages to the memory chip to carry out the host write command. A single write command from the memory controller (e.g. to store data in a particular page in the memory array) may involve multiple memory operations. A series of pulse and verify steps may be performed to program the page, with each step being considered as a different memory operation.

Figure 5:
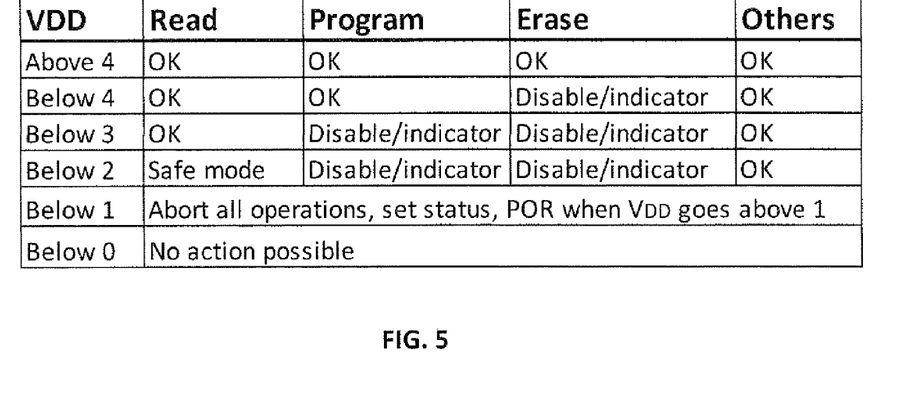
FIG. 5 is a table showing an example of actions taken when a power supply voltage drops below different threshold voltages in a flash memory.

FIG. 5 is a table showing an example of different threshold voltages that may be compared with $V_{DD}$ and certain memory operations that may be affected when $V_{DD}$ is below each level. The top line, where $V_{DD}$ is above level 4 corresponds to normal operation where $V_{DD}$ is at, or near, its nominal value. In this condition, $V_{DD}$ is sufficient to guarantee all memory operations, Read, Program, Erase, and Others (all memory operations are OK). When $V_{DD}$ is below level 4, there is sufficient voltage to guarantee Read, Program, and Others, but $V_{DD}$ is insufficient to guarantee Erase operations. This is because of the high voltage needed to erase a flash memory cell. When $V_{DD}$ is found to be below level 4, Erase operations may be disabled and/or a flag may be set or other indicator generated, to indicate that Erase operations are no longer guaranteed. Such an indicator may cause the memory controller to respond, for example, by postponing Erase operations, which are often performed as background operations that can easily be rescheduled, or by proceeding with a modified erase operation that includes additional verification that erase is successful. Alternatively, or in addition, the memory controller may provide some information to the host to reflect the condition. This could be an explicit indicator that the power supply voltage has dropped, allowing the host system to react accordingly. The information may simply be a reduction in the available capacity of the memory system to reflect that some blocks are consumed by obsolete data that cannot be erased (i.e. indicated available capacity is limited to already-erased blocks only). The host system may react by trying to restore the power supply voltage, e.g. by shutting down other operations that may be consuming electrical current from the battery, or by providing an indicator to a user that the battery is close to empty, or in some other way.

When $V_{DD}$ is found to be below level 3, Read and Other operations may still be guaranteed, but in addition to Erase operations, Program operations are no longer guaranteed at this voltage level. Program operations may be disabled and/or a flag or other indicator may be provided to indicate that programming is not guaranteed. Such an indicator may cause the memory controller to respond, for example, by postponing Program operations (e.g. by buffering data) or by proceeding with some modified Program operation. For example, additional redundancy may be added to the data to be written so that a higher number of errors can be corrected when the data is read. Data that was to be programmed in Multi-Level Cells (MLC) may be programmed in Single-Level Cells (SLC), which may improve the chances of successful programming even where $V_{DD}$ is low. Alternatively, or in addition, the memory controller may provide some information to the host to reflect the condition. This could be an explicit indicator that the power supply voltage has dropped, allowing the host system to react accordingly. This could be an indicator that the memory system is read-only, or some other indicator that stops the host from trying to send more data to be programmed. The host system may react by trying to restore the power supply voltage, e.g. by shutting down other operations that may be consuming electrical current from the battery, or by providing an indicator to a user that the battery is close to empty, or in some other way.

When $V_{DD}$ is found to be below level 2, in addition to Erase and Program operations, Read operations are no longer guaranteed. Read operations may be disabled and/or a flag or other indicator may be generated to indicate that read operations are no longer guaranteed. Such an indicator may cause the memory controller to respond, for example, by postponing read operations, or proceeding with some modified read operation. In the example of FIG. 5, data is read in a "safe mode" in which ECC is used to correct errors. Alternatively, or in addition, the memory controller may provide some information to the host to reflect the condition. This could be an explicit indicator that the power supply has dropped, allowing the host system to react accordingly. This could be an indicator that the stored data is unavailable, or that any data provided by the memory system should be regarded by the host as unreliable because of the low-power condition. The host system may react by trying to restore the power supply voltage, e.g. by shutting down other operations that may be consuming electrical current from the battery, or by providing an indicator to a user that the battery is close to empty, or in some other way. When $V_{DD}$ is below level 2, Other operations may still be guaranteed. Such Other operations may include various operations other than Erase, Program, and Read operations, such as writing device configuration registers or other registers. Power supply comparison carried out by the voltage comparison circuit may also be an operation that is in the Other category.

While FIG. 5 shows the same entry for Erase when $V_{DD}$ is below 4, below 3, and below 2, the memory system may treat Erase operations differently at these different levels. For example, Erase operations may proceed with some modified Erase operation when $V_{DD}$ drops below level 4, then generate an indicator that Erase operations are not guaranteed when $V_{DD}$ drops below level 3, and then disable Erase operations when $V_{DD}$ drops below level 2. Similarly, Program operations are no longer guaranteed below voltage level 3, so some action may be taken below level 3, and some different action may be taken below level 2. For example, Program operations may proceed in some modified form below level 3. Then, when $V_{DD}$ drops below level 2, Program operations may be disabled. Thus, the detailed information regarding $V_{DD}$ in this arrangement allows a discriminating response that depends on the degree to which $V_{DD}$ drops from its nominal value, the sensitivity of different memory operations to drops in $V_{DD}$ in the particular memory system, and to preferences that may be set by a host device or user. Such responses may allow at least some operations to continue even when $V_{DD}$ drops below its nominal level, thus extending the useful life of the battery by allowing at least limited operation as the battery approaches a fully-discharged condition. This is in contrast to certain prior systems which simply triggered a reset when $V_{DD}$ dropped by a certain amount from its nominal value.

When $V_{DD}$ is found to be below level 1, all operations are aborted, and an indicator is generated that reflects this condition. This may be an indicator to the memory controller, which in turn may send an indicator to the host. The host system may react by trying to restore the power supply voltage, e.g. by shutting down other operations that may be consuming electrical current from the battery, or by providing an indicator to a user that the battery is close to empty, or in some other way. If the power supply goes above level 1 again, a Power-On Reset (POR) is performed.

When $V_{DD}$ drops below level 0 in this example, there is insufficient power supply voltage to generate an indicator to reflect this condition. There is also insufficient power to perform voltage comparison. So generally, level 0 is not a voltage level that is monitored by a voltage comparison circuit, but rather is a voltage level below which the chip loses the ability to perform any functions including voltage management functions performed by a voltage comparison circuit and a power management circuit.

Figure 6:
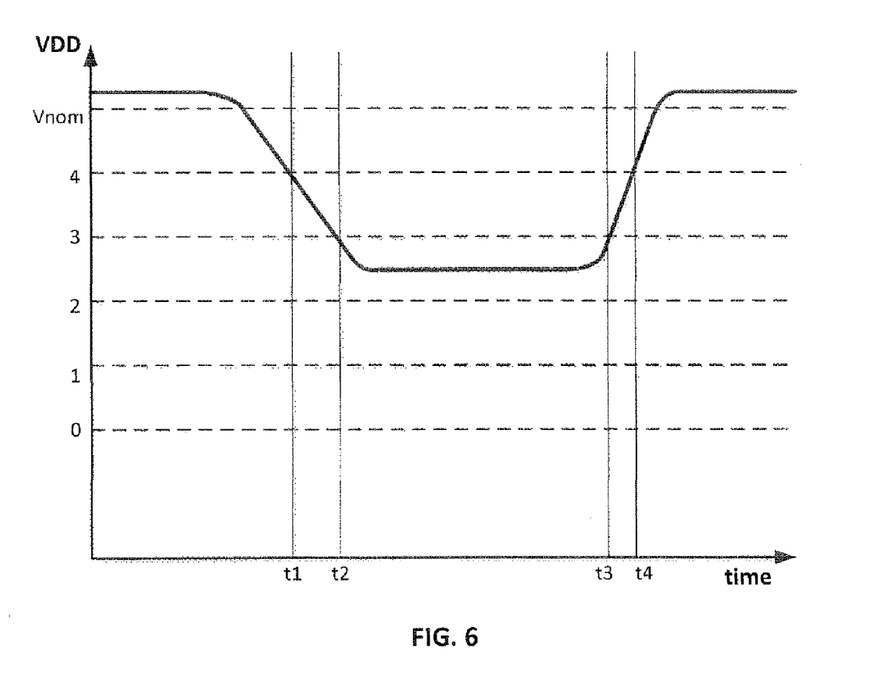
FIG. 6 illustrates a dip in a power supply voltage.

FIG. 6 shows an example of a dip in a power supply voltage $V_{DD}$. Initially, $V_{DD}$ is close to the nominal voltage Vnom. Subsequently, $V_{DD}$ starts to drop. $V_{DD}$ drops below level 4 at time t1, and drops below level 3 at time t2. Subsequently, $V_{DD}$ stabilizes below level 3 (and above level 2), and then rises above level 3 at time t3, and above level 4 at time t4. Such a dip may occur in many devices. For example, in a mobile device in which a battery provides power for multiple components, one or more components may draw significant power from the battery for a period, thus causing the power supply voltage to drop. Examples of components in mobile devices that may use such high current may include cameras, especially video cameras, or cameras using a flash for illumination, GPS components, and games that use significant processor capacity.

One way to deal with a dip such as shown in FIG. 6 is to disable any operations that may be affected (i.e. class 4 and class 3 operations), generate an indicator that these operations have been aborted, and to wait for the memory controller, or the host to reissue any commands. Thus, any recovery from this condition is left to the memory controller or the host. Alternatively, a memory chip may be able to handle dips like this internally, without generating an indicator or otherwise informing the memory controller or host. For example, when $V_{DD}$ drops below level 4, only Erase operations are at risk. Erase operations may continue in some modified form, or may be disabled temporarily without informing the host. When $V_{DD}$ drops below level 3, Program operations may continue in some modified form, or may be disabled temporarily without informing the host (e.g. data may be held in a buffer). Subsequently, when $V_{DD}$ returns to an adequate level, any disabled operations may be enabled and carried out. Thus, for example, class 4 operations may be disabled between t1 and t4, and class 3 operations may be disabled between t2 and t3. In some cases, disabled operations may be deferred for a predetermined period of time waiting for $V_{DD}$ to return to an adequate level, and after the predetermined period an indicator may be generated to inform the host. Thus, short drops in voltage are handled internally in the memory chip, while more extended voltage drops are communicated to the host.

Figure 7:
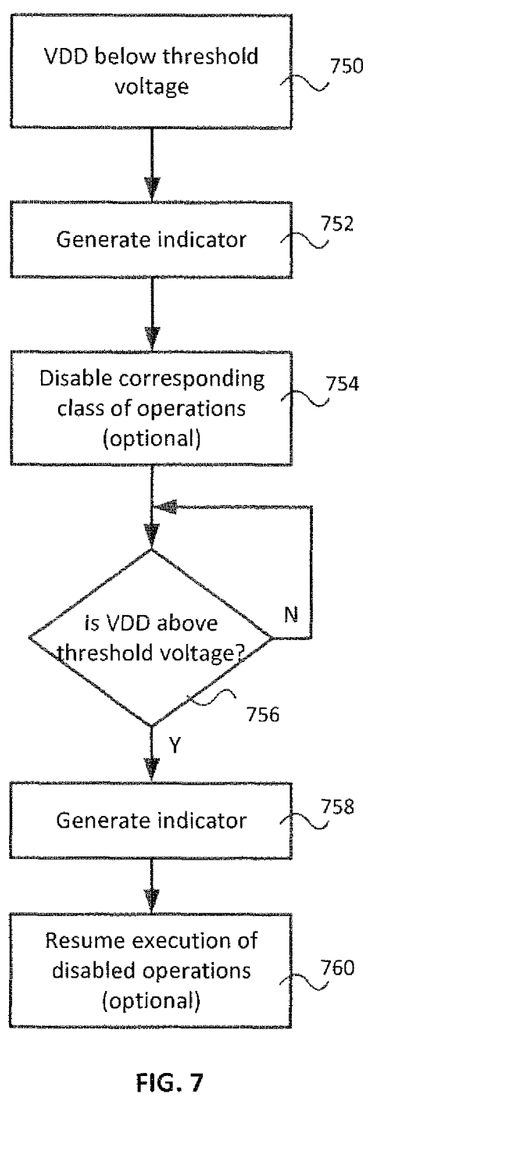
FIG. 7 is a flowchart of an example where a power supply voltage drops below a threshold voltage.

FIG. 7 is a flowchart of a power management scheme according to an embodiment. A comparison between $V_{DD}$ and a threshold voltage indicates that $V_{DD}$ is below the threshold voltage 750. An indicator is generated 752, which may be a flag that can be polled, or may be a signal that is sent to the memory controller and/or the host. A class of operations corresponding to the threshold voltage in question may be disabled at this point 754, although in some cases the operations proceed, either with some modification, or unmodified (even though successful completion is not guaranteed). Subsequently, $V_{DD}$ is monitored to see if it returns to its previous level 756, and if it is above the threshold voltage then an indicator may be generated 758, and disabled operations (if any) may be resumed 760.

Figure 8:
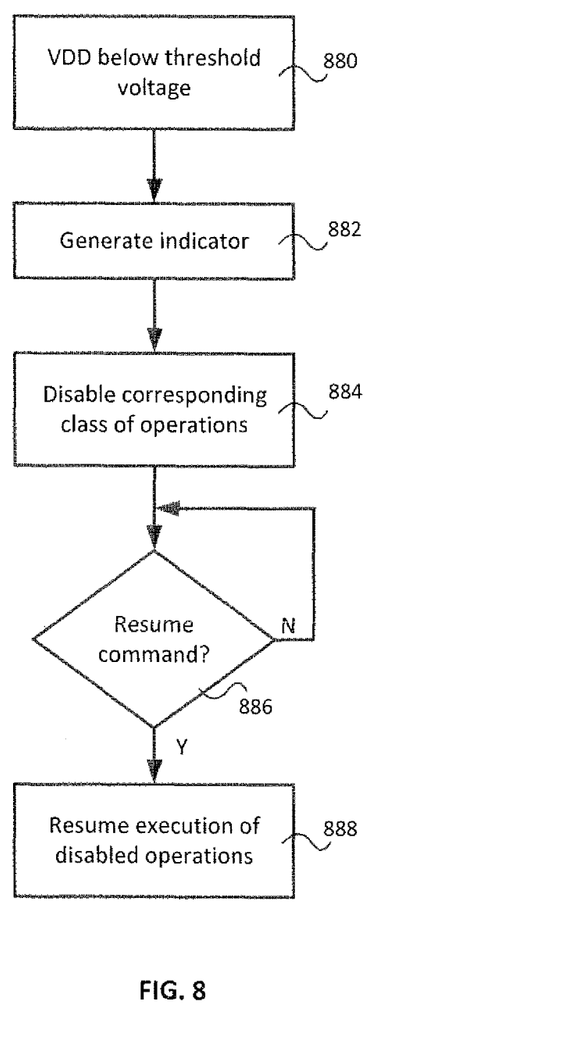
FIG. 8 is a flowchart of another example where a power supply voltage drops below a threshold voltage.

FIG. 8 is a flowchart of a power management scheme according to another embodiment. If $V_{DD}$ is below a particular threshold voltage 880 then an indicator is generated 882. A class of operations corresponding to the threshold voltage is disabled 884. The memory chip then waits for a command to resume the disabled class of operations 886. When such a command is received, any operations of the disabled class are resumed 888.

CONCLUSION

The foregoing detailed description has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby, enable others skilled in the art to best utilize the invention in various embodiments and with various modifications as are suited to the particular use contemplated. It is intended that the scope of the invention be defined by the claims appended hereto.

It is claimed:

1. A method of operating a nonvolatile memory chip comprising:
   comparing a power supply voltage to a plurality of threshold voltages that includes at least a first threshold voltage and a second threshold voltage that is lower than the first threshold voltage;
   when the power supply voltage drops below the first threshold voltage, disabling a first class of memory operations; and
   when the power supply voltage drops below the second threshold voltage, disabling the first class of memory operations and additionally disabling a second class of memory operations that is not disabled when the power supply voltage drops below the first threshold voltage.

2. The method of claim 1 wherein, when the power supply voltage drops below the first threshold voltage, the first class of memory operations is temporarily disabled and memory operations from the first class of memory operations are queued for later execution.

3. The method of claim 2 further comprising, subsequently executing the queued memory operations when the power supply voltage rises above the first threshold voltage.

4. The method of claim 1 further comprising, when the power supply voltage drops below the first threshold voltage, generating a first status indicator and waiting for a command to enable the first class of memory operations; and
   when the power supply voltage drops below the second threshold voltage, generating a second status indicator and waiting for a command to enable the second class of memory operations.

5. The method of claim 1 wherein the first class of memory operations includes a memory cell erasing operation and the second class of memory operations includes a memory programming operation.

6. The method of claim 5 wherein the plurality of threshold voltages further includes at least a third threshold voltage that is lower than the second threshold voltage, and a fourth threshold voltage that is lower than the third threshold voltage;
   when the power supply voltage drops below the third threshold voltage, disabling the first and second classes of memory operations and additionally disabling a third class of memory operations that is not disabled when the power supply voltage drops below the second threshold voltage; and
   when the power supply voltage drops below the fourth threshold voltage, disabling the first, second, and third classes of memory operations and additionally disabling a fourth class of memory operations that is not disabled when the power supply voltage drops below the third threshold voltage.

7. The method of claim 6 wherein the third class of memory operations includes a memory read operation and the fourth class of operations includes a register setting operation.

8. A nonvolatile memory chip comprising:
   an array of nonvolatile memory cells;
   a power input that receives an electrical supply at a supply voltage;
   a voltage comparison circuit connected to the power input, the voltage comparison circuit comparing the supply voltage to a first threshold voltage and a second threshold voltage, the voltage comparison circuit providing a first signal when the supply voltage is below the first threshold voltage and providing a second signal when the supply voltage is below the second threshold voltage; and
   a power management circuit that is configured to disable only a first class of memory operations in response to the first signal, the power management circuit configured to disable the first class of memory operations and additionally disable a second class of memory operations that is not disabled in response to the first signal, in response to the second signal.

9. The nonvolatile memory chip of claim 8 further comprising a command buffer that holds commands that correspond to disabled memory operations for later execution.

10. The nonvolatile memory chip of claim 8 wherein the voltage comparison circuit further compares the supply voltage to a third threshold voltage and a fourth threshold voltage, the voltage comparison circuit providing a third signal when the supply voltage is below the third threshold voltage and providing a fourth signal when the supply voltage is below the fourth threshold voltage; and the power management circuit is configured to disable the first class, second class, and a third class of memory operations in response to the third signal, and to disable the first class, second class, third class, and a fourth class of memory operations in response to the fourth signal.

11. The nonvolatile memory chip of claim 10 wherein the first class of memory operations includes an erase operation, the second class of memory operations includes a program operation, the third class of memory operations includes a read operation, and the fourth class of operations includes a register setting operation.

12. A method of operating a nonvolatile memory chip comprising:
    comparing a power supply voltage to a plurality of threshold voltages that includes at least a first threshold voltage, a second threshold voltage, a third threshold voltage, and a fourth threshold voltage;
    when the power supply voltage drops below the first threshold voltage, disabling only a first class of memory operations that includes a memory erase operation;
    when the power supply voltage drops below the second threshold voltage, disabling the first class of memory operations, and additionally disabling a second class of memory operations that includes a memory programming operation;
    when the power supply voltage drops below the third threshold voltage, disabling the first class of memory operations, the second class of memory operations, and additionally disabling a third class of memory operations, and providing a signal that indicates to a host that a low-power condition exists; and
    when the power supply voltage drops below the fourth threshold voltage, initiating a full chip reset and setting a chip error flag.

13. The method of claim 12 further comprising generating a first indicator when the power supply voltage drops below the first threshold voltage, generating a second indicator when the power supply voltage drops below the second threshold voltage.

14. A method of operating a nonvolatile memory chip comprising:
    comparing a power supply voltage to a plurality of threshold voltages that includes at least a first threshold voltage and a second threshold voltage that is lower than the first threshold voltage;
    when the power supply voltage drops below the first threshold voltage, generating a first status indicator; and
    when the power supply voltage drops below the second threshold voltage, generating a second status indicator.

15. The method of claim 14 further comprising: when the power supply voltage drops below the first threshold voltage, disabling a first class of memory operations; and when the power supply voltage drops below the second threshold voltage, disabling a second class of memory operations.

16. The method of claim 14 further comprising, when the power supply voltage drops below the first threshold voltage, continuing to perform a first class of memory operations that is no longer guaranteed to be successfully completed; and
    when the power supply voltage drops below the second threshold voltage, continuing to perform a second class of memory operations that is no longer guaranteed to be successfully completed.

17. The method of claim 16 wherein the second class of memory operations includes a memory program operation, further comprising: when the power supply voltage drops below the second threshold voltage, continuing to program in a modified manner.

18. The method of claim 14 wherein the plurality of threshold voltages further includes a third threshold voltage that is lower than the second threshold voltage, further comprising: when the power supply voltage drops below the third threshold voltage, generating a third status indicator and continuing to perform a third class of memory operations that is no longer guaranteed to be successfully completed.

19. The method of claim 18 wherein the third class of memory operations includes a memory read operation, and a memory read operation is continued in a safe manner that uses error correction coding.

* * * * *